United States Patent
Alpert et al.

(10) Patent No.: US 6,591,411 B2
(45) Date of Patent: Jul. 8, 2003

(54) APPARATUS AND METHOD FOR DETERMINING BUFFERED STEINER TREES FOR COMPLEX CIRCUITS

(75) Inventors: Charles Jay Alpert, Austin, TX (US); Rama Gopal Gandham, Wappingers Falls, NY (US); Jiang Hu, Austin, TX (US); Stephen Thomas Quay, Austin, TX (US); Andrew James Sullivan, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/810,075

(22) Filed: Mar. 15, 2001

(65) Prior Publication Data

US 2002/0133799 A1 Sep. 19, 2002

(51) Int. Cl.[7] ................................................. G06F 17/50
(52) U.S. Cl. ............................................. 716/13; 716/2
(58) Field of Search .................................. 716/13, 2, 14

(56) References Cited

U.S. PATENT DOCUMENTS

2001/0009031 A1 * 7/2001 Nitta et al. .................... 716/13
2001/0010090 A1 * 7/2001 Boyle et al. .................... 716/2

OTHER PUBLICATIONS

Lukas P.P.P. Van Ginneken, Buffer Placement in Distributed RC–tree Networks for Minimal Elmore Delay, 1990, ISCAS, vol. 2, pp. 865–868, New Orleans, LA, May 1–3.

* cited by examiner

Primary Examiner—Don Wong
Assistant Examiner—Thuy Vinh Tran
(74) Attorney, Agent, or Firm—Duke W. Yee; Casimer K. Salys; Stephen J. Walder, Jr.

(57) ABSTRACT

An apparatus and method for determining buffered Steiner trees for complex circuits is provided. The apparatus and method first clusters sinks with similar characteristics such as criticality, polarity and distance. The purpose of this step is to potentially isolate positive sinks from negative ones and non-critical sinks from critical ones. The present invention then constructs low-level Steiner trees over each of these clusters. Finally, a top-level timing driven Steiner tree is computed where each cluster is treated as a sink. The top-level tree is then merged with the low-level trees to yield a solution for the entire net.

45 Claims, 6 Drawing Sheets

FIG. 6

| K-Center Algorithm (S, k) |
|---|
| Input: S = {$s_1$, ..., $s_n$}    set of sinks<br>k = number of clusters<br><br>Output: {$N_1$, $N_2$, ..., $N_k$}    k-way clustering of S |
| 1. Choose a random s in the set S. Find s' in the set S such that dist(s,s') is maximum. W = {s'}. Let<br>    d=max{dist(s,s') \| s in the set S}. Set $N_1$= S.<br><br>2. While \| W \| < k do<br><br>3. Find s' in the set S/W such that d = min{dist(s,s') \| s in the set W} is maximized.<br>    W = the union of W and {s'}.<br><br>4. Relabel seeds in W as {$w_1$, $w_2$, ..., $w_{\|W\|}$} and Let {$N_1$, $N_2$, ..., $N_{\|W\|}$} be a \|W\|-way clustering where<br>    $N_i$ = {$w_i$} for $1 \leq i \leq \|W\|$.<br><br>5. for each s in the set of S/W<br>    Find the cluster seed $w_i$ in the set W such that dist(s, $w_i$) is minimized. Add s to cluster $N_i$.<br><br>6. return {$N_1$, $N_2$, ..., $N_k$} |

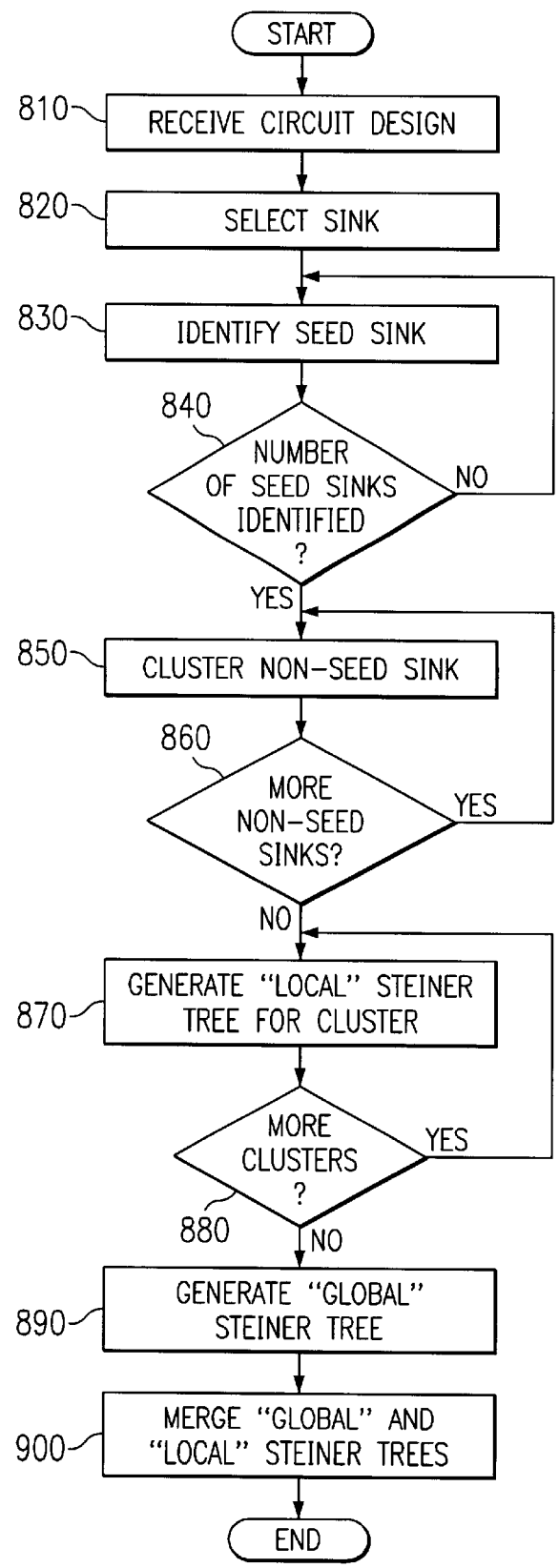

APPARATUS AND METHOD FOR DETERMINING BUFFERED STEINER TREES FOR COMPLEX CIRCUITS

BACKGROUND OF THE INVENTION

1. Technical Field

The present invention is directed to an apparatus and method for determining buffered Steiner trees for complex circuits.

2. Description of Related Art

It is now widely accepted that interconnect performance is becoming increasingly dominant over transistor and logic performance in the deep submicron regime. Buffer insertion is now a fundamental technology used in modern VLSI design methodologies. As gate delays decrease with increasing chip dimensions, however, the number of buffers required quickly rises. It is expected that close to 800,000 buffers will be required for 50 nanometer technologies. It is critical to automate the entire interconnect optimization process to efficiently achieve timing closure.

The problem of inserting buffers to reduce the delay on signal nets has been recognized and studied. A closed form solutions for two-pin nets have been proposed by van Ginneken. Van Ginneken's dynamic programming algorithm, described in "Buffer Placement in Distributed RC-tree Networks for Minimal Elmore Delay," Int'l Symposium on Circuits and Systems, 1990, pp. 865–868, which is hereby incorporated by reference, has become a classic in the field. Given a fixed Steiner tree topology, the van Ginneken algorithm finds the optimal buffer placement on the topology under an Elmore delay model for a single buffer type and simple gate delay model. Several extensions to this work have been proposed. Together, these enhancements make the van Ginneken style of buffer insertion quite potent as it can handle many constraints, buffer types, and delay models, while retaining optimality under many of these conditions. Most recently, research on buffer insertion has focused on accommodating various types of blockage constraints.

The primary shortcoming with the van Ginneken style of buffer insertion is that it is limited by the given Steiner topology. Thus, buffer insertion has been combined with Steiner tree constructions using a two-step approach of first constructing a Steiner tree, then running van Ginneken style buffer insertion. An optimal solution can be realized using the two-step approach if one uses the "right" Steiner tree (i.e., the tree resulting from ripping buffers out of the optimal solution) since the buffer insertion step is optimal. Of course, finding the right tree is difficult since the buffer insertion objective cannot be directly optimized.

The problem of obtaining the "right" Steiner tree becomes even more difficult as the complexity of the circuit design increases. Thus, it would be beneficial to have an apparatus and method of identifying an optimal Steiner tree for complex circuit designs.

SUMMARY OF THE INVENTION

The present invention provides an apparatus and method for determining buffered Steiner trees for complex circuits. The apparatus and method first clusters sinks with similar characteristics such as criticality, polarity and distance. The purpose of this step is to potentially isolate positive sinks from negative ones and non-critical sinks from critical ones. The present invention then constructs low-level Steiner trees over each of these clusters. Finally, a top-level timing driven Steiner tree is computed where each cluster is treated as a sink. The top-level tree is then merged with the low-level trees to yield a solution for the entire net.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 6 is an illustration describing the K-Center algorithm;

FIG. 8 is a flowchart outlining an exemplary operation of the present invention.

DETAILED DESCRIPTION OF THE PREFERRED EMBODIMENT

The present invention provides an apparatus and method for determining buffered Steiner trees for complex circuits. The buffered Steiner tree is used to identify optimum wiring paths between a source and one or more sinks. The present invention uses a two step approach to identifying an optimum buffered Steiner tree for complex circuits. In a first step, sinks in the circuit design are clustered and optimum local buffered Steiner trees are identified for each of the clusters. In a second step, the clusters are treated as sinks and an optimum global buffered Steiner tree for the clusters is identified. The combination of the global buffered Steiner tree and the local buffered Steiner trees for each cluster provides an overall optimum wiring pattern for the circuit design.

The present invention may be implemented in hardware, software, or a combination of hardware and software. In addition, the present invention may be implemented in a stand alone computing device, such as a personal computer, or in a distributed data processing system. For example, the present invention may be implemented on a server in a distributed data processing system in which a client device provides input to the server regarding a circuit design that is to be generated. The functions of the present invention, as detailed hereafter, may then be applied to the input received from the client device. The results of performing the functions of the present invention may then be returned to the client device for use by an user of the client device.

Figure 1:
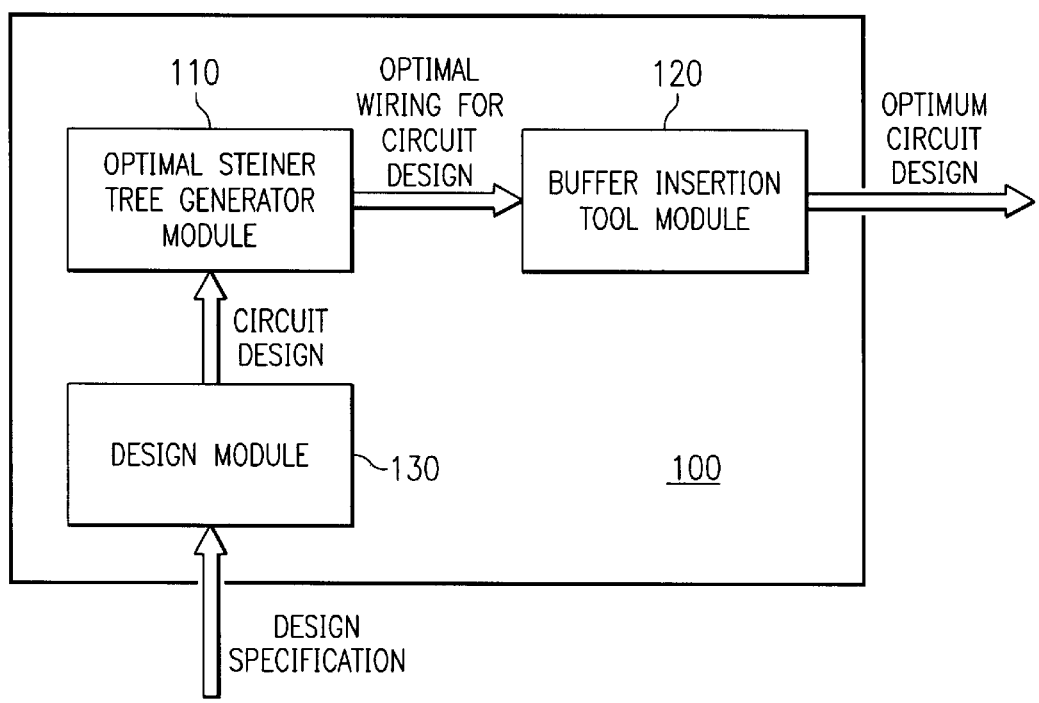
FIG. 1 is an exemplary block diagram illustrating the components of a design tool in accordance with the present invention.

With reference now to the figures, FIG. 1 is an exemplary block diagram illustrating the components of a design tool in accordance with the present invention. As shown in FIG. 1, the design tool 100 includes an optimal Steiner tree generator module 110, a buffer insertion tool module 120 and a design module 130. The design module 130 and the buffer insertion tool module 120 both operate in a manner generally known in the art.

In summary, the design module 130 receives a high-level design specification from a user and generates a chip design based on the high-level design specification. The chip design is then input to the optimal Steiner tree generator module 110 which generates an optimal wiring pattern for the chip design.

The optimal Steiner tree generator module 110 operates to generate an optimal Steiner tree in accordance with the methodology of the present invention described in more detail hereafter. In short, the optimal Steiner tree generator module 110 uses a two step process of clustering sinks in a circuit design based on similar characteristics and determining an optimal buffered Steiner tree for each cluster. The clusters are then treated as sinks and a global optimal buffered Steiner tree for the circuit is identified. The parameters that are input to the optimal Steiner tree generator module 110 may be input automatically from the design module 130, based on the particular design specification generated, may be input by a user via an input device, or the like.

The overall optimum buffered Steiner tree is then input to buffer insertion tool module 120 which takes the design specification and inserts appropriate buffers into the design to minimize delay along timing-critical paths, sharpen slew rates and fix capacitance and noise violations in the design. The buffer insertion tool module 120 may insert buffers into the local Steiner trees of the optimum buffered Steiner tree based on a correspondence of characteristics of the buffer with characteristics of the sinks in the cluster. The buffer insertion tool module 120 may further insert buffers into the global Steiner tree of the optimum buffered Steiner tree based on a correspondence of characteristics of the buffer with characteristics of the clusters, treating each cluster as a sink. The result is an optimized design that is output to the data processing system.

For the majority of the nets in a design, finding the right Steiner tree is easy (assuming no blockages or buffer resource constraints). For two-pin nets a direct connection is optimal, and there are a small number of possible topologies for five sinks or less.

The present invention focuses on the most difficult nets for which finding the appropriate Steiner topology is not at all obvious. These nets will typically have more than 15 sinks, varying degrees of sink criticalities, and differing sink polarity constraints. Optimizing these nets effectively is often critical, as large high-fanout nets are more likely to be in a critical path because they are inherently slow.

Figure 2:
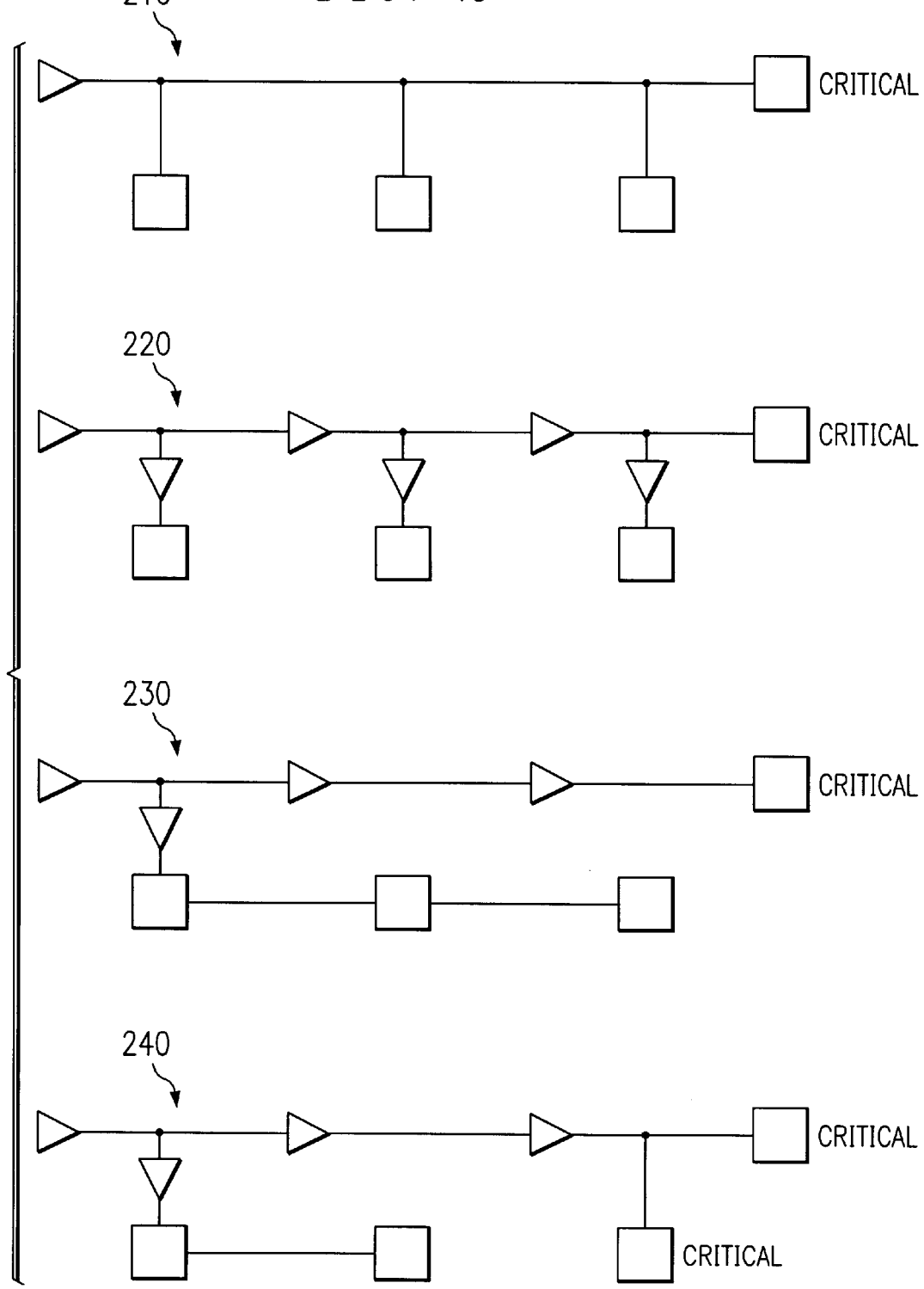
FIG. 2 is an exemplary block diagram illustrating possible Steiner trees for a four sink circuit design.

A good heuristic for finding the right Steiner tree must take into account potential buffering. Consider the 4-sink example shown in FIG. 2, where only one of the sinks is critical. The unbuffered tree 210 has minimum wire length, yet inserting buffers into the unbuffered tree 220 would require three buffers to decouple the three non-critical sinks, while the buffered tree 230 requires but one decoupling buffer. Thus, the buffered tree 230 uses fewer resources, and further may actually result in a lower delay to the critical sink since the driver in drives a smaller capacitive load than the buffered tree 220.

In prior art systems in which "optimum" Steiner trees are identified, the unbuffered tree 210 would be selected as the "optimum" Steiner tree for the 4-sink example because the prior art systems are not "buffer aware." That is the prior art systems do not operate taking into consideration that the optimum Steiner tree must accommodate the insertion of buffers into the circuit design.

The present invention identifies the topology of the buffered tree 230 as being optimal because the present invention takes into consideration the fact that buffer insertion is to take place after the optimal Steiner tree is determined. Thus, the identification of the optimal Steiner tree can determine the most likely placement of buffers in the Steiner tree to thereby determine if the Steiner tree is optimal or another Steiner tree should be utilized. The Steiner trees are identified by first clustering the non-critical sinks together and then forcing the topology to route everything within a cluster as a separate sub-tree.

If there are multiple critical sinks, such as in the tree 240, then a totally different topology which groups the critical sinks together in the same sub-tree likely yields the best solution. This tree would be identifiable if the critical sinks and non-critical sinks were clustered into two separate clusters and sub-trees were constructed for each cluster. The apparatus and method of the present invention is made aware of opportunities to manipulate the topology to allow potential off-loading of non-critical sinks in this manner.

The problem with the prior art solutions to optimal Steiner tree identification becomes more severe if one considers polarity constraints. During early synthesis, fanout trees are built to repower and distribute a signal and/or its complement to a set of sinks without knowledge of the layout of the net. Once the net is placed, the tree is often grossly suboptimal. At this stage, one can rip out the fanout and rebuild it using physical design information. However, ripping out the complete fanout tree of buffers and inverters may leave sinks with opposing polarity requirements.

Figure 3:
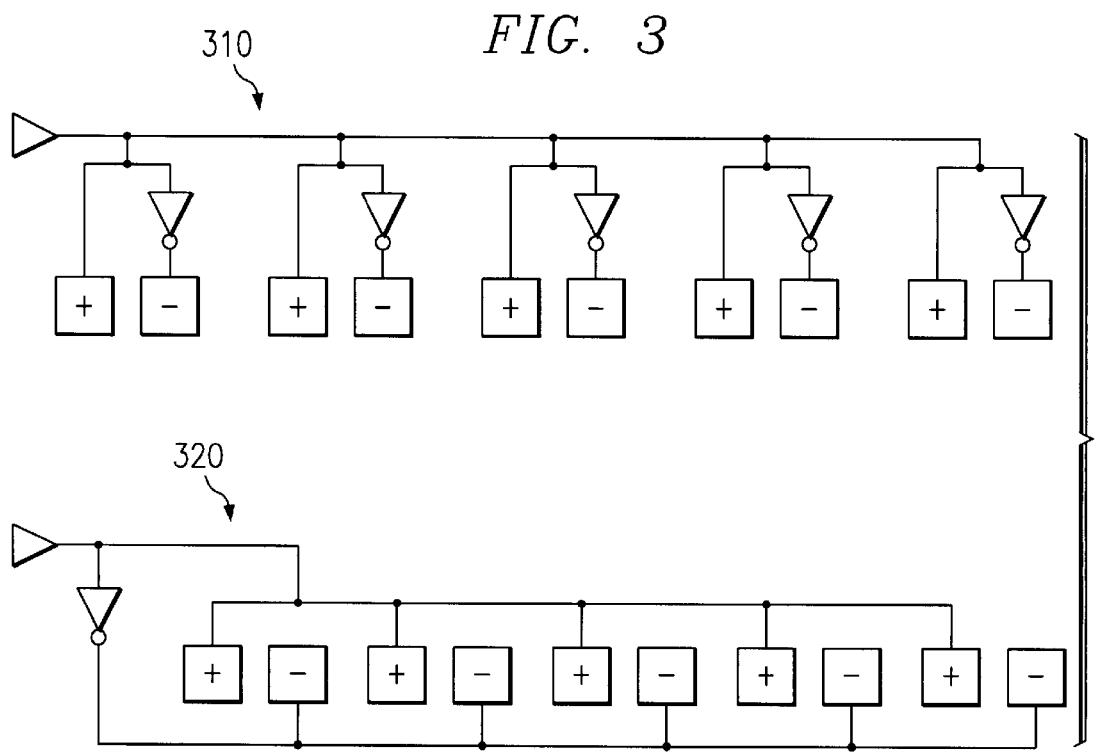
FIG. 3 shows a net with five sinks with normal polarity (indicated by a plus) and five with negative polarity (indicated by a minus)

FIG. 3 shows a net with five sinks with normal polarity (indicated by a plus) and five with negative polarity (indicated by a minus). The tree 310 requires a minimum of five inverters simply to ensure that polarity constraints are satisfied, while the tree 320 requires just one. This solution can be identified by the present invention by clustering the positive and negative sinks into two disjoint clusters and creating separate sub-trees for the sinks in each cluster. Notice that it is fairly easy to reduce the wire length in 320 while preserving the topology, which actually yields a self-overlapping tree. Existing timing-driven Steiner tree constructions cannot find this topology.

With the present invention, it is assumed that a given net $N=\{s_0, s_1, \ldots, s_n\}$ consists of n+1 pins, where $s_0$ is a unique source and $s_1, \ldots$, sn are the sinks. The terms x(s) and y(s) denote the 2 dimensional coordinates of pin s, and RAT(s) denotes the required arrival time for a sink s. Each sink s has a capacitance cap(s) and a polarity constraint pol(s), where pol(s)=0 for a normal sink and pol(s)=1 for an inverted sink. The constraint pol(s)=1 requires the inversion of the signal from $s_0$ to s, and pol(s)=0 prohibits the inversion of the signal. A rectilinear Steiner tree T(V,E) has a set of nodes V=N ∪ I where I is the set of intermediate 2 dimensional Steiner points and a set of edges E such that each edge in E is either horizontal or vertical. It is also assumed that wire resistance and capacitance parasitics are known in order to permit interconnect delay calculation for a particular geometric topology.

Given a Steiner tree T(V,E), a buffered Steiner tree TB(VB,EB) is constructed from T if (i) there exists a set of nodes V' (corresponding to buffers) such that VB=V ∪ V', (ii) each edge in EB is either in E or is contained within some edge E and (iii) TB is a rectilinear Steiner tree. Consequently, the original tree T may be obtained by contracting TB with respect to all nodes in V'/V. In other words, a buffered Steiner tree TB which can be constructed from T must have the same wiring topology as the unbuffered Steiner tree; buffers can only be inserted on the edges in T. Running a van Ginneken style buffer insertion algorithm on T is guaranteed to yield such a tree TB. Let nb(TB) be the number of buffers inserted in TB, i.e., |V'|.

Each Steiner tree (with or without buffers) has a unique path from $s_0$ to sink $s_i$. For each node $v \in V'$, let b(v) denote the particular buffer type (size, inverting, etc.) chosen from a buffer library B that is located at v. The delay from $s_0$ to $s_i$ within T is denoted as Delay($s_0,s_1,T$). The delay can be computed using a variety of techniques. For the purposes of the description of the preferred embodiment of the present invention, an Elmore delay model for wires and a switch-level linear model for gates is adopted. The present invention, however, is by no means restricted to these models.

The slack for a tree T is given by slack(T)=min{RAT($s_i$)−Delay($s_0,s_i,T$)||1≤i≤n}. The slack of a tree is the amount of extra time afforded for a signal to propagate on a net. Positive slack means the net could be longer and have worse delay characteristics in order to meet timing constraints for the circuit design. Negative slack means that the net is performing below expectations and must be modified. Once all nets in a chip design have positive slack, the chip is considered in working condition.

The obvious objective function for buffer insertion is to maximize slack(TB) for a buffered tree TB. This can clearly waste resources as several additional buffers may be used to garner only a few extra picoseconds of performance. Another alternative is to find the fewest buffers such that slack(TB)≧0. The problem with this formulation is often a zero slack solution is not achievable, yet it is still in the designer's interest to reduce the slack of critical nets, even if zero slack is not achievable.

Instead of addressing either objective, a set of solutions can be generated that trade-off maximizing the worst slack with the number of inserted buffers (or total buffer area). This can be done with a van Ginneken style algorithm or within a simultaneous optimization. Thus, the problem addressed by the present invention is stated as follows:

Given a net N, a buffer library B, and unit interconnect parasitics for the technology, find a single Steiner tree T over N so that the family F of buffered Steiner trees constructed from T by applying a van Ginneken style algorithm using B satisfies polarity constraints and is dominant. We say a family F is dominant if for every buffered tree TB', there exists a tree TB in F such that slack(TB)≧slack(TB') and nb(TB)≧nb(TB').

The problem is formulated in such a way that it might be possible that no optimal tree T exists because a dominant family may require multiple topologies. The purpose of this type of formulation is not to restrict the present invention to a particular buffer resource or timing constraint, but rather to allow the designer (or a post-processor) to find a solution within the family that is the most appropriate for the particular design.

Although not explicitly stated in this formulation, there is actually a third wire length component that can be traded off as well. For example, if the routing resources are more tightly constrained than the area resources, it might be more beneficial to reduce wire length at the price of additional buffers, while still maintaining the same timing characteristics. To handle this constraint, a combination of buffering and wire resources may be used instead of nb(TB) within the formulation. This would also allow encapsulation of wire sizing within the van Ginneken style optimization.

With the present invention, a "clustered tree" is utilized. The "clustered tree," or C-tree, is a Steiner tree construction which emphasizes the clustering step of the present invention as opposed to the underlying timing driven Steiner tree heuristic. The fundamental idea behind the C-tree is to construct the tree in two levels. The C-tree first clusters sinks with similar characteristics (criticality, polarity and distance). The purpose of this step is to potentially isolate positive sinks from negative ones and non-critical sinks from critical ones. The present invention then constructs low-level, or "local," Steiner trees over each of these clusters. Finally, a top-level, or "global," timing driven Steiner tree is computed where each cluster is treated as a sink. The top-level tree is then merged with the low-level trees to yield a solution for the entire net.

Overview of Optimum Steiner Tree Generator Module

Figure 4:
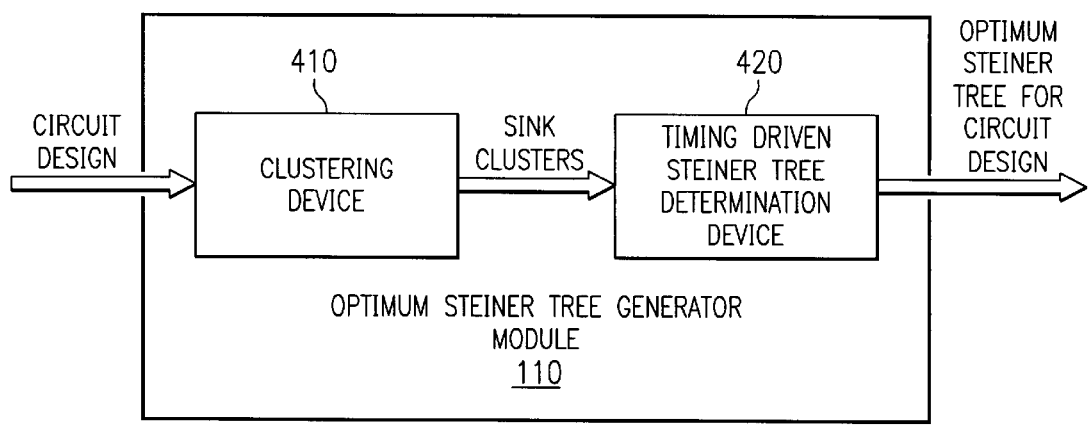
FIG. 4 is a diagram illustrating a more detailed description of the optimum Steiner tree generator module.

FIG. 4 is a diagram illustrating a more detailed description of the optimum Steiner tree generator module. Two devices are provided within the optimum Steiner tree generator module 130, a clustering device 410 and a timing driven Steiner tree determination device 420. These devices may be implemented in hardware, software, or a combination of hardware and software. In a preferred embodiment, the two devices 410–420 are provided as subroutines executed by a one or more processors in a data processing device.

With the present invention, the clustering device performs clustering of the sinks based on characteristics. Clustering involves taking the sinks of a net as input and outputting a set of clusters $\{N_1, N_2, \ldots, N_k\}$. The net corresponding to the top-level tree $N_0$ is also initialized to contain the source.

The clusters are then looked through and a tapping point $tp_i$ is computed for cluster $N_i$. The tapping point represents the source for the tree $T_i$ to be computed over $N_i$ and also the point where the top level tree $T_0$ will connect to $T_i$. Although there are several possible ways to compute the tapping point, in a preferred embodiment, $tp_i$ is a point on the bounding box of $N_i$ closest to $s_0$. Once the tapping point is chosen, it is added to $N_i$ as the source node. The timing driven Steiner routine then operates on $N_i$ to yield a tree $T_i$.

The timing driven Steiner tree determination device 420 then propagates the required arrival time up the sub-tree computed for $T_i$ to the tapping point. The capacitance for the sub-tree is also updated at the tapping point. After these operations have been done for all the tapping points, $N_0$ consists of $s_0$ plus the k tapping points which serve as sinks. The top-level Steiner tree for this instance is then computed and all the Steiner trees are merged into a single solution.

Figure 5:
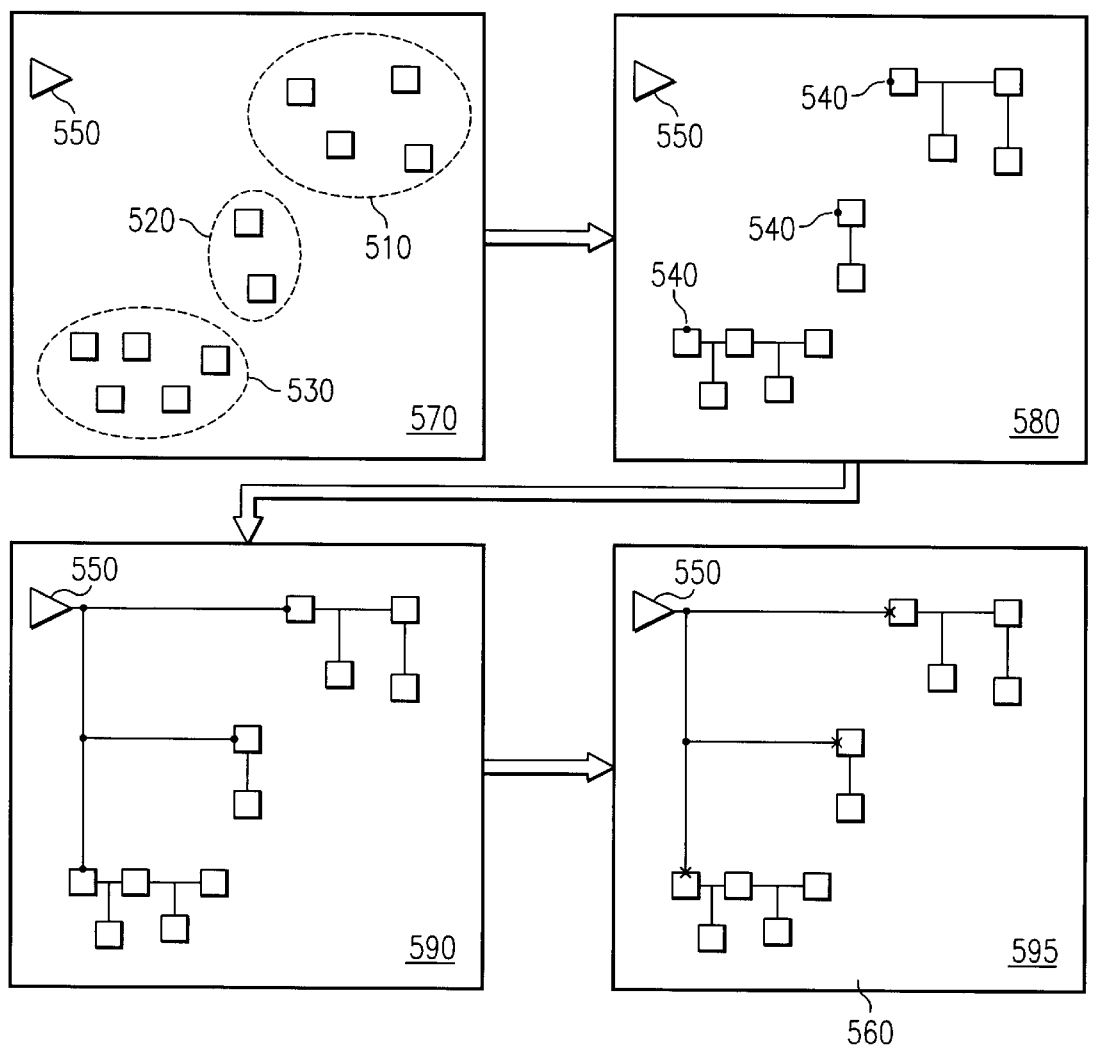
FIG. 5 illustrates an example operation of the present invention.

FIG. 5 illustrates an example operation of the present invention. As shown in FIG. 5, a clustering of sinks is performed (570). Note that in the example, the clustering is geometric but due to varying timing and polarity constraints, clusters 510–530 may overlap each other. The tapping point 540 is shown for each cluster 510–530 as a black circle, and the Steiner trees are then computed for each cluster (580). The top-level Steiner tree which connects the source 550 to the tapping points 540 is computed (590) and the tapping points 540 are removed and the existing Steiner edges merged to yield a single tree 560 for the entire net (595). The clear advantage of this approach is that van Ginneken style buffer insertion can insert buffers to either drive, decouple, or reverse polarity of any particular cluster. Of course, the present invention is sensitive to the actual clustering algorithm used, as described below.

Clustering

The key to clustering a set of data, e.g., a set of data representing sinks, in accordance with the present invention, is to devise a dissimilarity or distance metric between pairs of points. The sinks that are clustered using the present invention are characterized by three types of information: spatial information (coordinates in a plane), temporal information (required arrival times), and polarity information. In order to cluster the sinks using the present invention, a distance metric is defined that incorporates all of these elements. To do this, spatial, temporal and polarity metrics are first defined and then combined using appropriate scaling into a single distance metric.

Appropriate spatial and polarity metrics are fairly straightforward. For two sinks $s_i$ and $s_j$, the spatial distance between two sinks is denoted as:

$$SDist(s_i,s_j)=|x(s_i)-x(s_j)|+|y(s_i)-y(s_j)| \quad (1)$$

The polarity distance is denoted as:

$$Pdist(s_i,s_j)=|pol(s_i)-pol(s_j)| \quad (2)$$

The polarity distance has value zero when sinks have the same polarity and one otherwise.

Finding a temporal metric is more difficult. First, required arrival time (RAT) is not the only indicator of sink criticality. If two sinks $s_i$ and $s_j$ have the same RAT, yet $s_i$ is much further from the source than $s_j$, then $s_i$ is more critical since it will be much harder to achieve the RAT over the longer distance. An estimate of the achievable delay to $s_i$ must be incorporated in the distance metric to reflect the distance from the source.

If an optimally buffered direct connection is assumed from $s_0$ to $s_i$, with sub-trees decoupled by buffers with negligible input capacitance, then the achievable delay is equivalent to the formula for optimal buffer insertion on a two-pin net. The potential achievable delay from $s_0$ to $s_i$ can be determined using various formulas depending on various assumptions made for the particular technology. An example formula for defining achievable delay is provided in U.S. Pat. No. 6,044,209, entitled "Method and System for Segmenting Wires Prior to Buffer Insertion," patented on Mar. 28, 2000, which is hereby incorporated by reference.

The potentially achievable slack for $s_i$ is then $$AS(s_i)=RAT(s_i)-achDelay(s_i) \quad (3)$$

The achievable slack, $AS(s_i)$, gives a better indicator of the criticality of $s_i$ than $RAT(s_i)$. The achievable slack is a better indicator because it captures distance which is not taken into consideration in $RAT(s_i)$. For example, consider the driver/sink combination represented by the diagram C--A---B, where A is the driver and B and C are sinks with equal RAT values. If RAT is used, then it can be stated that it is equally hard to meet C's constraint as it is B's constraint since both have the same RAT values. This is clearly not true since B is much further away from A than C. Using achievable slack takes into account what would happen if you optimally buffered the net and then measured the difference in slacks between B and C.

Yet, a form like $|AS(s_i)-AS(s_j)|$ still does not capture the desired behavior. For example, assume that the achievable slack values for three sinks are given by $AS(s_1)=-1$ ns, $AS(s_2)=2$ ns, and $AS(s_3)=10$ ns. Sink $s_1$ is most critical while $s_2$ and $s_3$ are both non-critical. Thus, intuitively $s_2$ is more similar to $s_3$ than to $s_1$, despite the 8 ns difference between $s_2$ and $s_3$. A temporal metric needs to capture such behavior.

In order to capture such behavior in the temporal metric, the criticallity of si is denoted $crit(s_i)$, where $crit(s_i)=1$ if $s_i$ is the most critical sink and $crit(s_i)\rightarrow 0$ as $AS(s_i)\rightarrow\infty$. In other words, the criticality of a sink is one if it is most critical and zero if it is totally uncritical; otherwise, it lies somewhere between zero and one. With the present invention, the following measure of criticality is utilized:

$$Crit(s_i)=e^{a(mAs-AS(si))/(aAs-mAS)} \quad (4)$$

where $mAS=\min\{AS(s_i)\|1\leq i\leq n\}$ and $aAS=\Sigma AS(s_i)/n$. Here mAS and aAS are the minimum and average AS values over all sinks and a>0 is a user parameter. One can see that indeed $crit(s_i)$ is one where $AS(s_i)=mAS$ and zero as $AS(s_i)$ goes to infinity.

For a sink $s_i$, where average achievable slack ($AS(s_i)=$ aAS), then $crit(s_i)=e^{-a}$ is about 0.135 when $a=2^3$. This average sink will have a criticality much closer to that of a sink with infinite AS as opposed to minimum AS. We can now define temporal distance as the difference in criticalities:

$$Tdist(s_i,s_j)=|crit(s_i)-crit(s_j)| \quad (5)$$

If two sinks $s_i$ and $s_j$ are both extremely non-critical, but have different achievable slacks, their temporal distance will be practically zero. For example, assume that mAS=−1 ns, aAS=1 ns, a=2, and the two sinks have achievable slacks of 7 ns and 11 ns. The respective criticalities are e-9 and e-12, so $tDist(s_i,s_j)=0.0004$. Both temporal and polarity distances are on a zero to one scale, so the spatial distance is scaled to make combining the terms easier for the complete distance metric.

In order to scale the spatial distance, the spatial diameter of a set of sinks is denoted as $$sDiam(N)=\max\{sDist(s_i,s_j)\|1\leq I, j\leq n\} \quad (6)$$

The scaled distance between two sinks can be expresses as $$SDist(s_i, s_j)/sDiam(N) \quad (7)$$

The complete distance metric is a linear combination of the spatial, temporal, and polarity distances:

$$Dist(s_i,s_j)=\beta*(sDist(s_i,s_j)/sDiam(N))+(1-\beta)*tDist(s_i,s_j)+pDist(s_i,s_j) \quad (8)$$

The parameter $\beta$ lies between 0 and 1 and trades off between spatial and temporal distance. In experiments, $\beta$ is approximately 0.65 based on empirical studies. With the above distance relationship, the distance between two sinks with the same polarity will always be less than or equal to the distance between two sinks with opposite polarity. This occurs because two sinks with the same polarity have their distance bounded above by one, while two sinks with opposite polarity have their distance bounded below by one. This property ensures that polarity takes precedence over spatial and temporal distance in determining dissimilarity, which is important to avoiding the behavior shown the tree 210 in FIG. 2.

The distance metric defined above is used to determine the distances, or dissimilarities, of the sinks in the circuit design. Based on these distances, a sink may be clustered with other sinks that are most like it. A buffered Steiner tree is then generated for each cluster.

In order to cluster sinks, a K-Center heuristic, such as that described in T. F. Gonzales, "Clustering to Minimize the Maximum Intercluster Distance," Theoretical Computer Science, 38, pp. 293–306, 1985, which is hereby incorporated by reference, may be used. The K-Center heurisitic described in Gonzales seeks to minimize the maximum radius (distance to the cluster center) over all clusters.

K-Center is just one of several potential clustering methods, such as bottom-up matching and complete-linkage, that may be used to achieve the purpose of grouping sinks with common characteristics. Any method of clustering may be used with the present invention without departing from the spirit and scope of the present invention.

K-Center iteratively identifies points that are furthest away, which are called cluster seeds. The remaining points are clustered to their closest seed. For example, let diam $(N_i)$=maxp,q$\epsilon N_i${dist(p,q)} be the diameter of any set of points $N_i$. For geometric instances, K-Center guarantees that the maximum diameter of any cluster is within a factor of two of the optimal solution.

The complete description of the K-Center algorithm is shown in FIG. 6. As shown in FIG. 6, in step 1 a random sink s is picked and the sink s' that is furthest away from s is identified. The sink s' will lie on the periphery of the data set. This step identifies s' as the first cluster seed, which are all contained in the set W. Steps 2–5 iteratively find |W|-way clusterings for N until the ratio of the diameter of the largest current cluster to the diameter of n falls below the threshold D.

Step 3 identifies the next seed which is furthest away from already identified seeds. Steps 4–5 then form a clustering by assigning each sink to the cluster corresponding to its closest seed. After the diameter threshold is reached in Step 2, Step 6 returns the final clustering. The procedure has O(nk) time complexity.

Figure 7A:
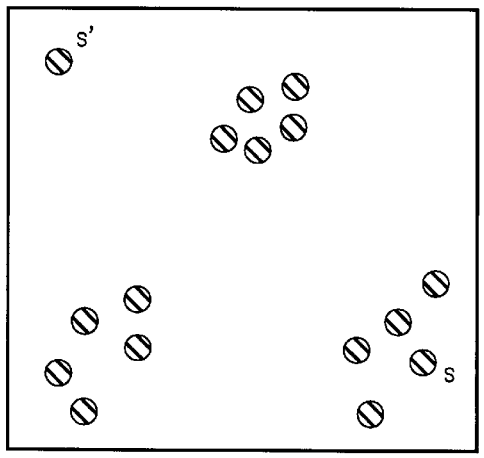
FIGS. 7A–7D are diagrams illustrating an example of the K-Center algorithm.
Figure 7B:
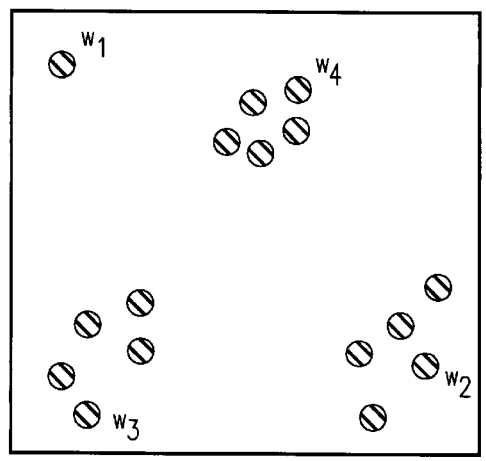
Figure 7C:
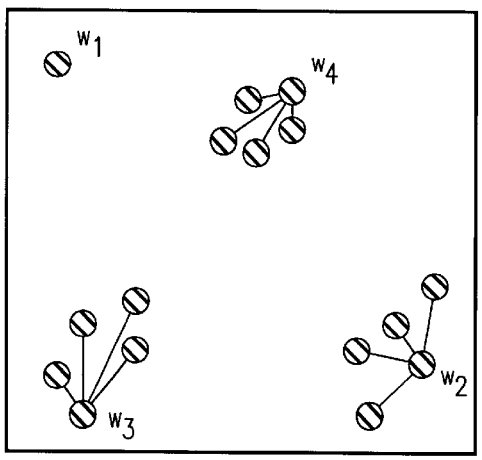

FIGS. 7A–7C illustrates an example of the K-Center algorithm applied to a two dimensional data set with 16 points where k=4. The parameter k represents the number of clusters to be used. The parameter k is set by a user of the present invention. A smaller value for k results in fewer buffering resources but more wiring resources. A larger value of k will use more buffering and fewer wiring resources. The value for k, in a preferred embodiment, is within the range 2≦k≦number of sinks.

In FIG. 7A, a random point s is chosen and then the point s' which is furthest from s is identified. In FIG. 7B, s' is relabeled $w_1$, a cluster seed and other seeds are identified in the manner described above. The order that the four seeds are identified are indicated by the subscripts; $w_2$ is furthest from $w_1$, $w_3$ is furthest from both $w_1$ and $w_2$, and $w_4$ is furthest from $w_1$, $w_2$, and $w_3$. As shown in FIG. 7C, the remaining points are then clustered according to their distance from a seed point.

Figure 7D:
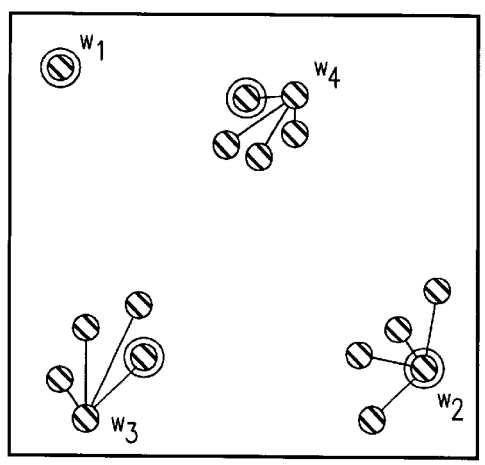

Once the clusters are identified, a "local" Steiner tree is generated for each of the clusters, as illustrated in FIG. 7D. The clusters themselves, are then treated as sinks so that a "global" Steiner tree is generated for wiring the clusters. The combination of the "local" and "global" Steiner trees provides the optimum Steiner tree for the circuit design which may then be input to the buffer insertion tool module.

Timing Driven Steiner Tree Construction

In a preferred embodiment, for the timing driven Steiner tree construction, a Prim-Dijkstra trade-off method is adopted. The Prim-Dijkstra trade-off method is described in Alpert et al., "Prim-Dijkstra Tradeoffs for Improved Performance-Driven Routing Tree Design," IEEE Tans. On Computer-Aided Design, 14(7), 1995, pp. 890–896, which is hereby incorporated by reference. The Prim-Dijkstra trade-off method trades off between Prim's minimum spanning tree algorithm and Dijkstra's shortest path tree algorithm via a parameter c which lies between 0 and 1. The justification behind this approach is that Prim's algorithm yields minimum wire length (for spanning tree), while Dijkstra's results in minimum tree radius. A trade-off captures the desirable properties of both approaches.

With the present invention, the Prim-Dijkstra algorithm for c=0.0, 0.25, 0.5, 0.75, 1.0 is run and after each spanning tree construction, a post-processing algorithm is run to remove overlapping edges and generate a Steiner tree. Of the five constructions, the tree T which minimizes slack(T) is selected. A second post-processing step is then invoked to reduce delay further.

In this second post-processing step, each sink is in turn visited, the connection from the sink to the existing tree is ripped up, and alternative connections to the tree are attempted. Any connection which either decreases wire length or improves slack is preserved.

Alternative timing-driven Steiner tree algorithms may be used rather than the Prim-Dijkstra algorithm for performing one or both of local and global Steiner tree generation without departing from the spirit and scope of the present invention. The Prim-Dijkstra method is used in a preferred embodiment because it is simple to implement and is efficient and scalable.

FIG. 8 is a flowchart outlining an exemplary operation of the present invention. As shown in FIG. 8, the operation starts with receiving a circuit design (step 810). A sink in the circuit design is selected as a starting seed sink (step 820). A seed sink is identified by calculating the distance metric between the already identified seed sinks and all other sinks in the circuit design and selecting the furthest sink from the already identified seed sinks (step 830). A determination is then made as to whether a predetermined number of seed sinks have been identified (step 840). If not, the operation returns to step 830.

If all of the seed sinks are identified, the operation then clusters a non-seed sink to a cluster associated with a closest seed sink (step 850). The "closeness" is determined based on a distance metric, such as that described above. A determination is made as to whether any more non-seed sinks exist in the circuit design (step 860). If so, the operation returns to step 850.

If no more non-seed sinks exist, the operation then generates a "local" Steiner tree for one of the identified clusters (step 870). The operation then determines if any more identified clusters remain that have not had a "local" Steiner tree generated (step 880). If so, the next cluster is selected and the operation returns to step 870.

If no more clusters remain, the operation then generates a "global" Steiner tree treating each cluster as if it were a sink (step 890). The Steiner trees (local and global) are then merged to generate an optimum Steiner tree for the circuit design (900). The operation then ends.

Thus, the present invention provides a mechanism by which optimum Steiner trees may be identified for complex circuits. The present invention takes into consideration the spatial, temporal, and polarity similarities of sinks in the circuit design to perform clustering of the sinks. Steiner trees for each of these clusters are then generated and a global Steiner tree is generated. The combination of the local and global Steiner trees provide an optimum solution for circuit wiring for the circuit design.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, CD-ROMs, and transmission-type media such as digital and analog communications links.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method of determining a wiring pattern for related buffer insertion in a circuit design, comprising:
   clustering sinks of the circuit design based on similarities of one or more characteristics of the sinks into one or more clusters;
   generating a local wiring pattern in a Steiner tree format for each cluster;
   generating a global wiring pattern to each of the one or more clusters in a Steiner tree format; and
   performing buffer insertion based on the local wiring pattern and global wiring pattern.

2. The method of claim 1, wherein the similarities of characteristics of the sinks are identified by a distance metric between the sinks.

3. The method of claim 2, wherein the distance metric includes one or more of a spatial distance, a temporal distance, and a polarity distance between the sinks.

4. The method of claim 3, wherein the distance metric includes a combination of two or more of the spatial distance, the temporal distance and the polarity distance between the sinks.

5. The method of claim 3, wherein the polarity distance is defined as an absolute value of a difference in polarity of two of the sinks.

6. The method of claim 3, wherein the temporal distance is defined as an absolute value of a difference between criticalities of two of the sinks.

7. The method of claim 2, wherein the distance metric is defined as $$Dist(s_i,s_j)=\beta^*(sDist(s_i,s_j)/sDiam(N))+(1-\beta)^*tDist(s_i,s_j)+pDist(s_i,s_j)$$

where $s_i$ is a first sink i, $s_j$ is a second sink j, $sDist(s_i,s_j)$ is a spatial distance between the first sink and the second sink, $tDist(s_i,s_j)$ is a temporal distance between the first sink and the second sink, $pDist(s_i,s_j)$ is a polarity distance between the first sink and the second sink, $sDiam(N)$ is a spatial diameter of the sinks, and $\beta$ is a parameter having a value between 0 and 1, inclusive.

8. The method of claim 1, wherein performing buffer insertion includes inserting buffers into the local wiring pattern based on a correspondence of buffer characteristics with sink characteristics of each cluster.

9. The method of claim 1, wherein performing buffer insertion includes inserting buffers into the global wiring pattern based on a correspondence of buffer characteristics and cluster characteristics.

10. The method of claim 1, wherein generating a global wiring pattern includes generating a Steiner tree in which each of the one or more clusters is treated as if it were a sink.

11. The method of claim 1, wherein the one or more characteristics include sink polarity.

12. The method of claim 1, wherein generating a local wiring pattern includes computing a tapping point for the local wiring pattern.

13. The method of claim 12, wherein the tapping point is a point on a bounding box of a cluster, that is closest to a source.

14. The method of claim 12, wherein generating the local wiring pattern further includes:
   propagating a required arrival time up a the local wiring pattern to the tapping point; and
   calculating a capacitance at the tapping point.

15. The method of claim 14, wherein the steps of computing a tapping point, propagating a required arrival time, and calculating a capacitance are performed for each of the one or more clusters.

16. The method of claim 15, wherein generating a local wiring pattern further includes:
   clustering the source and each of the tapping points for each of the one or more clusters into a source cluster.

17. The method of claim 1, wherein clustering sinks of the circuit design based on similarities of one or more characteristics includes using a K-Center heuristic to cluster the sinks.

18. The method of claim 1, wherein generating a local wiring pattern includes using a Prim-Dijkstra trade-off algorithm to generate a Steiner tree for each of the one or more clusters.

19. The method of claim 1, wherein generating a global wiring pattern includes using a Prim-Dijkstra trade-off algorithm to generate a Steiner tree connecting each of the one or more clusters.

20. A computer program product in a computer readable medium of determining a wiring pattern for related buffer insertion in a circuit design, comprising:
   first instructions for clustering sinks of the circuit design based on similarities of one or more characteristics of the sinks into one or more clusters;
   second instructions for generating a local wiring pattern in a Steiner tree format for each cluster;
   third instructions for generating a global wiring pattern to each of the one or more clusters in a Steiner tree format; and
   fourth instructions for performing buffer insertion based on the local wiring pattern and global wiring pattern.

21. The computer program product of claim 20, wherein the similarities of characteristics of the sinks is identified by a distance metric between the sinks.

22. The computer program product of claim 21, wherein the distance metric includes one or more of a spatial distance, a temporal distance, and a polarity distance between the sinks.

23. The computer program product of claim 22, wherein the distance metric includes a combination of two or more of the spatial distance, the temporal distance and the polarity distance between the sinks.

24. The computer program product of claim 22, wherein the polarity distance is defined as an absolute value of a difference in polarity of two of the sinks.

25. The computer program product of claim 22, wherein the temporal distance is defined as an absolute value of a difference between criticalities of two of the sinks.

26. The computer program product of claim 21, wherein the distance metric is defined as $$Dist(s_i,s_j)=\beta^*(sDist(s_i,s_j)/sDiam(N))+(1-\beta)^*tDist(s_i,s_j)+pDist(s_i,s_j)$$

where $s_i$ is a first sink i, $s_j$ is a second sink j, $sDist(s_i,s_j)$ is a spatial distance between the first sink and the second sink, $tDist(s_i,s_j)$ is a temporal distance between the first sink and the second sink, $pDist(s_i,s_j)$ is a polarity distance between the first sink and the second sink, sDiam(N) is a spatial diameter of the sinks, and $\beta$ is a parameter having a value between 0 and 1, inclusive.

27. The computer program product of claim 20, wherein the fourth instructions for performing buffer insertion include instructions for inserting buffers into the local wiring pattern based on a correspondence of buffer characteristics with sink characteristics of each cluster.

28. The computer program product of claim 20, wherein the fourth instructions for performing buffer insertion include instructions for inserting buffers into the global wiring pattern based on a correspondence of buffer characteristics and cluster characteristics.

29. The computer program product of claim 20, wherein the third instructions for generating a global wiring pattern include instructions for generating a Steiner tree in which each of the one or more clusters is treated as if it were a sink.

30. The computer program product of claim 20, wherein the one or more characteristics include sink polarity.

31. The computer program product of claim 20, wherein the second instructions for generating a local wiring pattern include instructions for computing a tapping point for the local wiring pattern.

32. The computer program product of claim 31, wherein the tapping point is a point on a bounding box of a cluster, that is closest to a source.

33. The computer program product of claim 31, wherein the second instructions for generating the local wiring pattern further include:
  instructions for propagating a required arrival time up a the local wiring pattern to the tapping point; and
  instructions for calculating a capacitance at the tapping point.

34. The computer program product of claim 33, wherein the instructions for computing a tapping point, instructions for propagating a required arrival time, and instructions for calculating a capacitance are executed for each of the one or more clusters.

35. The computer program product of claim 34, wherein the second instructions for generating a local wiring pattern further include:
  instructions for clustering the source and each of the tapping points for each of the one or more clusters into a source cluster.

36. The computer program product of claim 20, wherein the first instructions for clustering sinks of the circuit design based on similarities of one or more characteristics include instructions for using a K-Center heuristic to cluster the sinks.

37. The computer program product of claim 20, wherein the second instructions for generating a local wiring pattern include instructions for using a Prim-Dijkstra trade-off algorithm to generate a Steiner tree for each of the one or more clusters.

38. The computer program product of claim 20, wherein the third instructions for generating a global wiring pattern include instructions for using a Prim-Dijkstra trade-off algorithm to generate a Steiner tree connecting each of the one or more clusters.

39. An apparatus for determining a wiring pattern for a circuit design, comprising:
  means for clustering sinks of the circuit design based on similarities of one or more characteristics of the sinks into one or more clusters;
  means for generating a local wiring pattern for each cluster in a Steiner tree format;
  means for generating a global wiring pattern to each of the one or more clusters in a Steiner tree format; and
  means for performing buffer insertion based on the local wiring pattern and global wiring pattern.

40. The apparatus of claim 39, wherein the similarities of characteristics of the sinks are identified by a distance metric between the sinks.

41. The apparatus of claim 40, wherein the distance metric includes one or more of a spatial distance, a temporal distance, and a polarity distance between the sinks.

42. The apparatus of claim 41, wherein the distance metric includes a combination of two or more of the spatial distance, the temporal distance and the polarity distance between the sinks.

43. The apparatus of claim 39, wherein the means for performing buffer insertion includes means for inserting buffers into the global wiring pattern based on a correspondence of buffer characteristics and cluster characteristics.

44. The apparatus of claim 39, wherein the means for performing buffer insertion includes means for inserting buffers into the local wiring pattern based on a correspondence of buffer characteristics with sink characteristics of each cluster.

45. An apparatus for determining a wiring pattern for a circuit design, comprising:
  a clustering device; and
  a Steiner tree determination device coupled to the clustering device, wherein the clustering device clusters sinks of the circuit design based on similarities of one or more characteristics of the sinks into one or more clusters, and wherein the Steiner tree determination device generates a local Steiner tree for each cluster and a global Steiner tree connecting each of the one or more clusters.

* * * * *